United States Patent

Suzuki

[15] 3,678,408

[45] July 18, 1972

[54] TRANSISTOR PROTECTIVE CIRCUIT

[72] Inventor: Tadao Suzuki, Toyko, Japan

[73] Assignee: Sony Corporation, Toyko, Japan

[22] Filed: Dec. 8, 1970

[21] Appl. No.: 96,287

Related U.S. Application Data

[63] Continuation of Ser. No. 775,386, Nov. 13, 1968, abandoned.

[52] U.S. Cl. ................................ 330/207 P, 330/24, 330/26
[51] Int. Cl. ................................ H03t 27/00, H03t 1/38
[58] Field of Search ................................ 307/202; 330/207 P

[56] References Cited

UNITED STATES PATENTS

| | | | |
|---|---|---|---|
| 3,500,218 | 3/1970 | Burwen | 330/207 P |
| 3,564,338 | 2/1971 | Teshirosi et al. | 317/31 |
| 3,262,016 | 7/1966 | Martin | 317/33 |

*Primary Examiner*—Nathan Kaufman
*Attorney*—Hill, Sherman, Meroni, Gross & Simpson

[57] ABSTRACT

A protective circuit for a transistor which limits the maximum allowable collector power loss so as to prevent the transistor from being destroyed is disclosed. A second transistor is connected in circuit with the main transistor to control the power loss in the main transistor. In one embodiment the protective transistor has a linear response and in another embodiment the protective circuit has a different slope in different operating ranges.

4 Claims, 13 Drawing Figures

INVENTOR.

TADAO SUZUKI

BY Hill, Sherman, Meroni, Gross & Simpson ATTORNEYS

INVENTOR

TADAO SUZUKI

BY Hill, Sherman, Meroni, Gross & Simpson

ATTORNEYS

TRANSISTOR PROTECTIVE CIRCUIT

This application is a continuation of Ser. No. 775,386 filed Nov. 13, 1968 and now abandoned.

BACKGROUND OF THE INVENTION

This invention relates in general to circuits for protecting transistors and in particular to a transistor protective circuit utilizing a current limiter.

DESCRIPTION OF THE PRIOR ART

In transistors the power loss at the collector heats the junctions of the transistors and can destroy the transistors when the temperature exceeds a predetermined value.

The maximum allowable power loss at the collector is substantially constant and when the collector voltage rises in an emitter-grounded transistor, for example, the collector power loss is likely to exceed the maximum permissive value and damage the transistor unless the collector current is decreased. For example, in a transistorized single ended push-pull circuit, commonly referred to as a SEPP circuit, that has its load short-circuited will have only an output coupled capacitor as the load. Such a load will have an impedance close to zero and will be reactive and will shift the phase relationship between the collector voltage and the collector current such that when the collector voltage is at a maximum with respect to a low input, the maximum collector current will flow and will cause the collector power loss to exceed its safe range.

It has been proposed in the prior art to utilize a current limiter for holding the collector current within its desired range even under such conditions. A current limiter serves to hold the collector current below a certain maximum value independent of the collector voltage and under certain conditions holds the collector power loss within a safe range. When an inductive load such as a speaker coil, for example, of about 4 ohms is connected in series to the output coupling capacitor in a SEPP circuit, there is no possibility of introducing a phase shift between the collector voltage and the collector current to insure that the transistor operates even if the collector current exceeds the operating current value of the current limiter. Also, the use of a current limiter limits the maximum output attainable at the load. Also, even if the collector current is lower than the value set by the current limiter, if the collector voltage goes up the collector power loss may exceed its maximum value and result in destruction of the transistor because the current limiter does not prevent such breakage.

SUMMARY OF THE INVENTION

Ideal protection of a transistor is obtained by the use of a current limiter which has a characteristic so that its current limiting value increases when the collector voltage is low and decreases when the collector voltage is high. This means that the operating point of the current limiter must vary with the collector voltage.

It is an object of the present invention to provide a transistor protective circuit which employs a current limiter that varies the limiting level as a function of the voltage applied to the main transistor to be protected. In one embodiment a transistor amplifier is connected with a limiting transistor such that the limiting transistor adjusts the limiting current of the transistor amplifier to prevent injury to the transistor.

DESCRIPTION OF THE PREFERRED EMBODIMENTS

Figures 1, 2, 3, 4, 5, 6, 7:
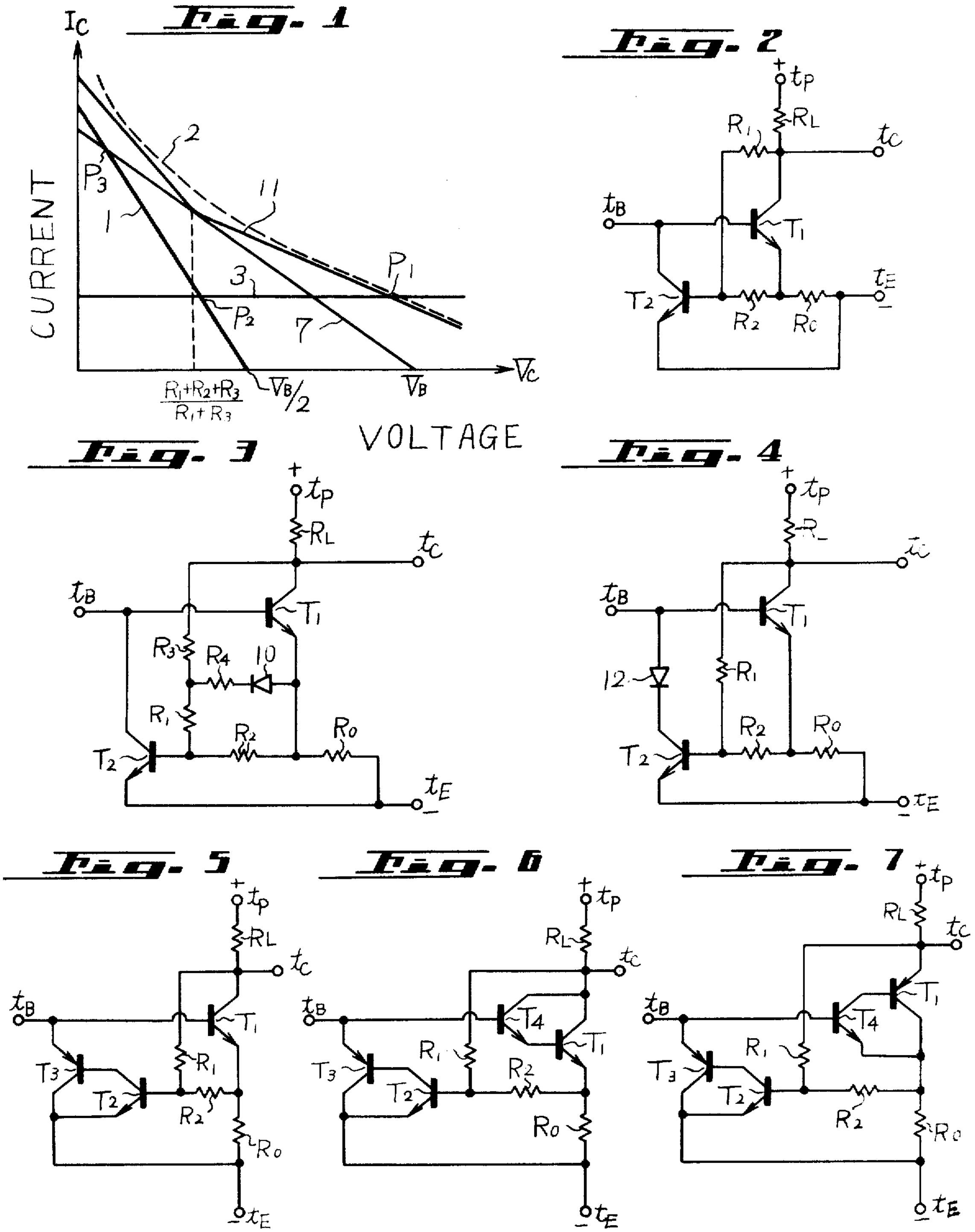
FIG. 1 is a graph illustrating voltage-current characteristic curves for this invention.
FIG. 2 is a schematic view of the invention.
FIG. 3 is a schematic of a modification of the invention.
FIG. 4 is a schematic of a further modification of the invention.
FIG. 5 is a schematic view of a modification of the invention.
FIG. 6 is a schematic view of a modification of the invention.
FIG. 7 is a schematic view of a modification of the invention.
Figure 8:
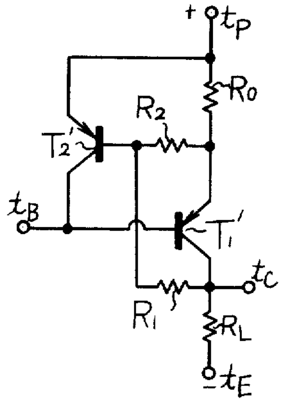
FIG. 8 is a schematic view of a modification of the invention.
Figure 9:
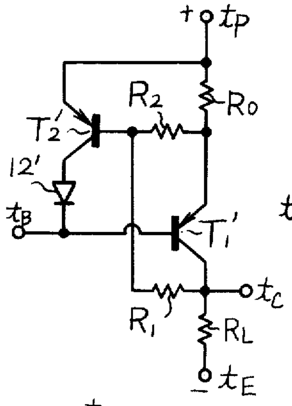
FIG. 9 is a schematic view of a modification of the invention.
Figure 10:
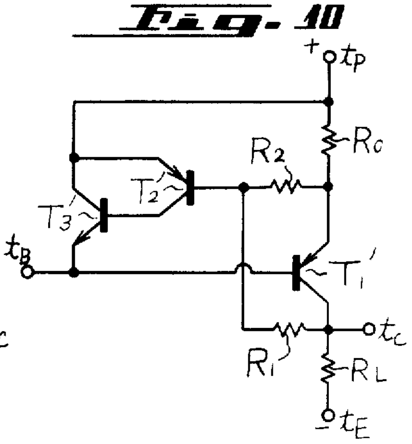
FIG. 10 is a schematic view of a modification of the invention.
Figure 11:
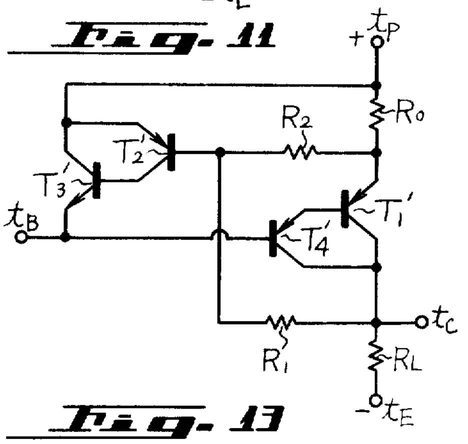
FIG. 11 is a schematic view of a modification of the invention.

Various circuits have been proposed for protecting transistors from overload such as the so-called SEPP circuit which employs a current limiting circuit. For example, in FIG. 1 numeral 1 represents a load line, dotted curve 2 represents the maximum permissible collector power loss (Pc curve). Curve 3 represents a current limiting level. Prior art current limiting circuits are incorporated in SEPP circuits so as to prevent the current from going above the level defined by curve 3 which holds the maximum power loss at $P_1$ where curve 3 crosses curve 2. The voltage $V_B$ represents the power source voltage at point $P_1$ and the voltage at the connection point of the transistors for deriving a load voltage is $V_{B/2}$. A current limiting circuit holds the output of the SEPP circuit less than a value defined by point $P_2$ where load curve 1 crosses current limiting level 3. When the collector power loss enters into a range higher than the point $P_1$, defined by the curves 2 and 3, it is possible that the current limiting circuit will not prevent damage to the transistors.

The present invention prevents damage to a transistor. For example, FIG. 2 illustrates a main transistor $T_1$ which is to be protected and which is shown as NPN-type transistor, for example. The transistor $T_1$ has its base connected to an input terminal $t_B$ and has its collector connected to an output terminal $t_C$ and to a power source terminal $t_P$ through a load resistor $R_L$. A control transistor $T_2$ has its collector connected to the base of transistor $T_1$ and its base is connected to a junction point between resistors $R_1$ and $R_2$ that are connected between the collector and emitter of the transistor $T_1$. The emitter of transistor $T_2$ is connected to a terminal $t_E$ which is connected through the resistor $R_O$ to the emitter of the transistor $T_1$. The base of the control transistor $T_2$ is supplied through resistor $R_2$ a voltage related to the collector current of the main transistor $T_1$.

During normal operation, the control transistor $T_2$ is in the off state and does not conduct. However, when the collector power loss of the main transistor $T_1$ exceeds its given limit range, the control transistor $T_2$ becomes conductive to control the base current flowing to the transistor $T_1$ to decrease its collector current, thus protecting the transistor $T_1$ from damage. If the collector current and voltage between the collector and emitter of the main transistor $T_1$ are designated as $I_C$ and $V_C$, respectively and the voltage between the base and emitter of the control transistor $T_2$ is designated as $V_{BE}$ it follows that:

$$V_{BE}=(R_2/R_1+R_2)\,V_C+R_O I_C \quad (1)$$

The first term of the right side of this equation represents a voltage related to the collector voltage of the transistor $T_1$ and the second term represents a voltage related to its collector current, and these voltages are applied to the base of the transistor $T_2$. Equation 1 can be rewritten as:

$$I_C=\frac{V_{BE}}{R_0}-\frac{R_2}{R_0(R_1+R_2)}V_C \quad (2)$$

Thus, when the voltage $V_C$ equals zero, a current of $V_{BE}/R_O$ flows, and the value of the current being controlled decreases as the collector voltage increases with a slope of $R_2/R_O$ $(R_1 + R_2)$. This is indicated by the straight line 7 of FIG. 1.

Thus, an approximation of the straight line 7 to the curve 2 will increase the working range of the main transistor $T_1$. For example, in the case of an SEPP circuit, the main transistor can be driven up to point $P_3$ where the load curve 1 crosses the straight line so that its output will be increased correspondingly.

If the terminal $t_B$ is connected to the connection point between the base of the main transistor $T_1$ and the collector of the transistor $T_2$, and the terminal $t_C$ is connected to the collector of the transistor $T_1$ and the terminal $t_E$ is connected to the connection point between the emitter of the transistor $T_2$ and the resistor $R_O$ and if the terminals $t_B$, $t_C$ and $t_E$ are considered as analogous to the base, collector and emitter electrodes of a transistor, the protective circuit may be applied to other transistor circuits.

Although the current limiting effect is produced by the straight line 7 which approximates the permissible collector power loss curve 2 by the circuitry of FIG. 2, a more accurate approximation may be made by a line having two parts with different slopes. Such a characteristic is obtained with the circuit of FIG. 3. In FIG. 3, elements similar to those in FIG. 2 are identified by the same reference numerals and characters. A resistor $R_3$ is connected between terminal $t_C$ and the resistor $R_1$ and the resistor $R_4$ and the diode 10, such as a Zener diode, is connected between the emitter of transistor $T_1$ and the junction point between resistors $R_1$ and $R_3$.

In the circuit of FIG. 3, when the voltage between the collector and emitter of the main transistor $T_1$ is low, the Zener diode 10 will stay in the off state and the circuit will operate similar to the circuit of FIG. 2. In other words, the collector current $I_C$ decreases relatively abruptly with an increase in the collector-emitter voltage $V_C$. When the collector voltage $V_C$ exceeds a certain value, the Zener diode 10 will become conductive due to the Zener effect and a constant voltage will be applied to the base of the control transistor $T_2$ and at the same time a voltage related to the collector current $I_C$ will be fed to the base of the transistor $T_2$. In this range the collector voltage-current characteristics of the main transistor $T_1$ will have a relatively general slope. If the voltage across the Zener diode 10 is designated as $V_Z$, when:

$$V_C < \frac{V_Z}{\dfrac{R_1 + R_2}{R_1 + R_2 + R_3}}, \qquad (3)$$

it follows that:

$$I_C = \frac{V_{BE}}{R_0} - \frac{R_2}{R_0} \cdot \frac{V_C}{R_1 + R_2 + R_3} \qquad (4)$$

when:

$$V_C > \frac{V_Z}{\dfrac{R_1 + R_2}{R_1 + R_2 + R_3}}, \qquad (5)$$

it follows that:

$$I_C = \frac{V_{BE}}{R_0} - \frac{R_2}{R_0} \cdot \frac{R_3}{R_4} \cdot \frac{V_Z}{\dfrac{R_3}{R_4}(R_1 + R_2) + R_1 + R_2 + R_3} - \frac{R_2}{R_0} \cdot \frac{V_C}{\dfrac{R_3}{R_4}(R_1 + R_2) + R_1 + R_2 + R_3} \qquad (6)$$

This is illustrated as curve 11 in FIG. 1 which has two parts. Thus, when the collector voltage $V_C$ is low, the curve 11 has a relatively steep slope but when the collector voltage $V_C$ is above a value of $$\frac{R_1 + R_2 + R_3}{R_1 + R_2} VZ$$

the curve takes on a gentler slope close to curve 2.

FIG. 4 illustrates a modification of the circuit of FIG. 2 in which a diode 12 is connected between the base of the transistor $T_1$ and the collector of the transistor $T_2$. The diode 12 will prevent current from flowing from the base of the transistor $T_2$ to the collector when the main transistor $T_1$ is non-conductive.

The diode 12 may be replaced with a third transistor $T_3$ as shown in FIG. 5 to prevent the unwanted conduction of the transistor $T_2$ and the composite $h_{FE}$ of the transistors $T_2$ and $T_3$ rises to provide for improved control efficiency.

FIG. 6 illustrates a further modification wherein a fourth transistor $T_4$ is connected in circuit with the transistor $T_1$ to provide a Darlington connection. FIG. 7 illustrates transistors $T_1'$ and $T_4$ which are of different conductivity types connected in a Darlington circuit.

FIGS. 8 through 12 are the equivalent circuits PNP-type transistors instead of the NPN-types illustrated in FIGS. 2 and 4–7. For example, the circuit in FIG. 8 has transistors $T_1'$ and $T_2'$ which are PNP-types and the circuit operates as the circuit of FIG. 2. The circuit of FIG. 9 corresponds to the circuit of FIG. 4 except the transistors $T_1'$ and $T_2'$ are PNP-types. The circuit of FIG. 10 corresponds to the circuit of FIG. 5 except the transistors $T_1'$, $T_2'$ and $T_3'$ are PNP-types instead of NPN's.

Figure 12:
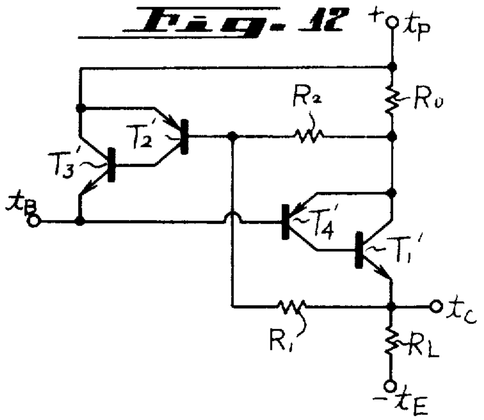
FIG. 12 is a schematic view of a modification of the invention.

The circuit of FIG. 12 corresponds to the circuit of FIG. 7 except the types of the transistors $T_1'$ through $T_4'$ are different types than in FIG. 7.

Figure 13:
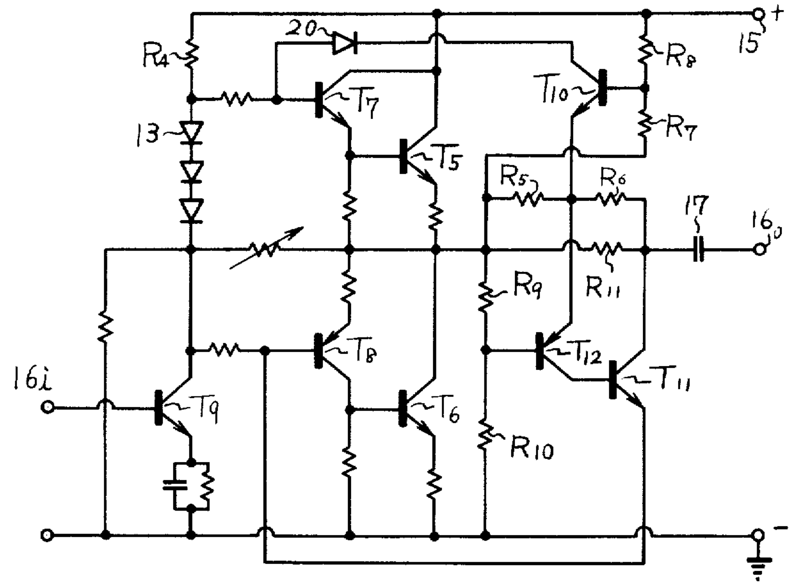
FIG. 13 is a schematic view of a modification of the invention illustrating a single-ended push-pull amplifier.

FIG. 13 illustrates a semi-complementary SEPP circuit which has transistors $T_5$, $T_6$, $T_7$ and $T_8$ where the NPN-type transistor $T_7$ and the PNP-type transistor $T_8$ and respectively, connected to the NPN-type transistors $T_5$ and $T_6$. The transistors $T_7$ and $T_8$ are driven by a common driving transistor $T_9$. The driving transistor $T_9$ is connected to a power supply terminal 15 through a bias supply comprising the diodes 13 and a resistor $R_4$. An input terminal 16*i* is connected to the base of transistor $T_9$ and an output terminal 16*o* is coupled through a capacitor 17 to the collector of the transistor $T_{11}$. The transistor $T_{10}$ is connected as a control transistor for the transistor $T_7$. A resistor $R_{11}$ is connected to the connection point between the transistors $T_5$ and $T_6$ and the capacitor 17. A pair of voltage dividing resistors $R_5$ and $R_6$ are connected across the resistor $R_{11}$. The emitter of transistor $T_{12}$ is connected to the connection point between resistors $R_5$ and $R_6$. The collector of the transistor $T_{10}$ is connected to the base of transistor $T_7$ through a diode 20 connected in a forward direction relative to the transistor $T_{10}$.

A pair of resistors $R_7$ and $R_8$ are connected between the connection point between transistors $T_5$ and $T_6$ and the power supply terminal 15. The junction point between resistors $R_7$ and $R_8$ is connected to the base of the transistor $T_{10}$. A transistor $T_{11}$ is connected to protect the transistor $T_8$ and the emitter of the transistor $T_{11}$ is connected to the base of the transistor $T_8$ and its collector is connected to the connection point between the capacitor 17 and the resistor $R_{11}$.

The base of the transistor $T_{11}$ is connected to the collector of a transistor $T_{12}$ which has its emitter connected to the connection point between resistors $R_5$ and $R_6$. The base of transistor $T_{12}$ is connected to the connection point of resistors $R_9$ and $R_{10}$ which are connected from the connection point of the transistors $T_5$ and $T_6$ and ground. In the circuit of FIG. 13 when either of the transistors $T_7$ and $T_8$ is conductive the other is non-conductive and a reverse voltage is applied between the base and emitter of the non-conductive transistor. The diode 20 is connected in series with the protective control transistor $T_{10}$ or the transistor $T_{12}$ of opposite polarity to transistor $T_{11}$ is connected to the transistor $T_{10}$ to prevent lowering of the input impedance. The voltage dividing resistors $R_5$ and $R_6$ which are connected in parallel with resistor $R_{11}$ correspond to resistor $R_O$ in FIG. 2 and a voltage is produced across the resistor $R_{11}$ which is fed to the transistors $T_{10}$ and $T_{11}$.

The protective circuit of this invention allows the efficient use of transistors and eliminates the destruction of transistors due to overload. Apparatus according to this invention has been constructed and tested and the output of an amplifier which previously produced 50W was safely raised to a level of 100W by the use of the invention described herein.

It will be apparent that many modifications and variations may be effected without departing from the scope of the novel concepts of this invention.

I claim as my invention:

1. A protective circuit for protecting a main transistor which receives an input signal on its base from an input terminal comprising:

a unilateral current device;

a second transistor connected with its emitter and collector in series with the unilateral current device between the base of the main transistor and an output terminal;

three resistors connected in series between the collector and emitter of the main transistor and developing a voltage proportional to the voltage between the emitter and collector of the main transistor;

the base of the second transistor connected to the junction point between the one of said three resistors connected to the collector of said main transistor and the second of said three resistors to receive a signal indicative of the voltage between the emitter and collector of the main transistor;

a fourth resistor connected to the emitter of said second transistor and to the junction point between said second and third resistors so as to supply a voltage proportional to the collector current of the main transistor to the second transistor such that when the voltage between the collector and emitter of the main transistor is low the collector voltage versus current characteristic of the main transistor will have a relatively steep slope and when the collector voltage exceeds a predetermined value the collector voltage versus current characteristic of the main transistor will have a relatively gentle slope.

2. A protective circuit according to claim 1 comprising a fifth resistor connected between the emitter of said second transistor and said output terminal.

3. A protective circuit according to claim 2 including a third transistor with its base connected to the emitter of said main transistor and its collector connected to the collector of said main transistor and a sixth resistor connected between the emitter of said third transistor and the junction point between said second and third resistors.

4 A protective circuit according to claim 3 including a fourth transistor of opposite type to said main transistor receiving said input signal on its base from said input terminal, seventh and eighth resistors connected in series between the emitter of said fourth transistor and said output terminal, a fifth transistor with its collector connected to said output terminal and its emitter connected to the base of said fourth transistor, and the base of said fifth transistor connected to the junction point between said seventh and eighth resistors.

* * * * *